United States Patent
Jellus

(10) Patent No.: US 7,859,262 B2
(45) Date of Patent: Dec. 28, 2010

(54) METHOD AND DEVICE FOR MAGNETIC RESONANCE IMAGING ON THE BASIS OF A PARTIALLY PARALLEL ACQUISITION (PPA)

(75) Inventor: Vladimir Jellus, Erlangen (DE)

(73) Assignee: Siemens Aktiengesellschaft, Munich (DE)

( * ) Notice: Subject to any disclaimer, the term of this patent is extended or adjusted under 35 U.S.C. 154(b) by 237 days.

(21) Appl. No.: 12/271,116

(22) Filed: Nov. 14, 2008

(65) Prior Publication Data

US 2009/0134870 A1    May 28, 2009

(30) Foreign Application Priority Data

Nov. 16, 2007   (DE) ...................... 10 2007 054 863

(51) Int. Cl.
*G01V 3/00* (2006.01)
(52) U.S. Cl. ...................... 324/309; 324/307
(58) Field of Classification Search ......... 324/300–322; 600/407–445
See application file for complete search history.

(56) References Cited

U.S. PATENT DOCUMENTS

| | | | |
|---|---|---|---|
| 6,680,610 B1 * | 1/2004 | Kyriakos et al. | 324/307 |
| 6,828,788 B2 * | 12/2004 | Wang | 324/309 |
| 7,282,917 B1 | 10/2007 | Brau et al. | |
| 7,394,252 B1 * | 7/2008 | Lin | 324/309 |
| 7,482,806 B2 * | 1/2009 | Stemmer et al. | 324/307 |
| 7,511,495 B2 * | 3/2009 | Kholmovski et al. | 324/310 |
| 7,777,487 B2 * | 8/2010 | Ying et al. | 324/309 |
| 2006/0284812 A1 | 12/2006 | Griswold et al. | |

OTHER PUBLICATIONS

"On The Regularization Of Sense and Space-Rip in Parallel MR Imaging," Hoge et al, IEEE International Symposium on Biomedical Imaging 2004 (pp. 241-244).

* cited by examiner

*Primary Examiner*—Brij B Shrivastav
(74) *Attorney, Agent, or Firm*—Schiff Hardin LLP

(57) ABSTRACT

In a method, apparatus and computer-readable medium for magnetic resonance imaging of a contiguous region of a human body on the basis of partially parallel acquisition (PPA) by excitation of nuclear spins and measurement of radio-frequency signals representing the excited spins, are implemented. A k-space single channel reference image [R_kal] is calculated from the previously measured reference lines of a sub-coil series of N sub-coils with a phase-sensitive combination method. A GRAPPA coefficient matrix [W] is calculated by solving the equation system [R_kal]=[W]×[I_kal] wherein [I_kal] represents one block from the sub-coil series. A k-space single channel image [R] is successively completed by applying [W] to successive blocks [I_z] shifted relative to one another, the blocks [I_z] being of a previously measured, under-sampled sub-coil series of the N sub-coils, and [R] is transformed into image space.

9 Claims, 7 Drawing Sheets

FIG 3
A)
CHA: Plurality of signals = signals of the component coils
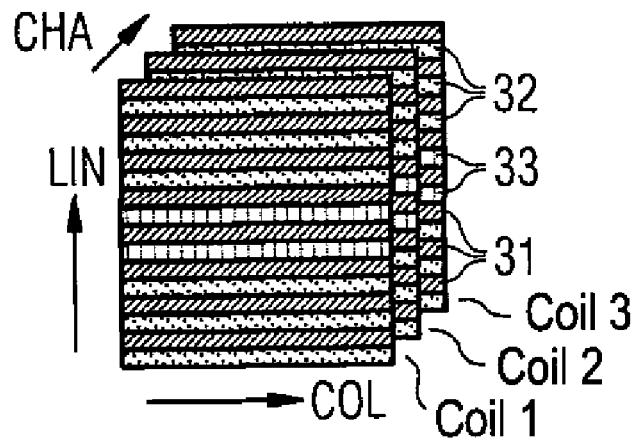
B)
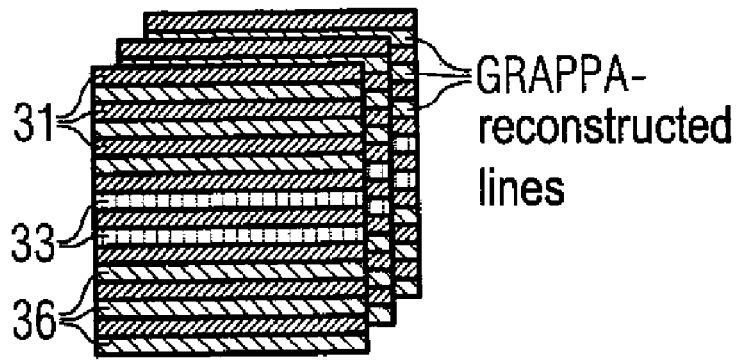
▨ measured lines
▭ measured reference lines
▧ unmeasured (omitted) lines
▩ GRAPPA-reconstructed lines

FIG 5

A) [with labels: ←[I_z]→, [R_z], AF=2, rows 1,2,3,4,...,N]

B) [with labels: ←[I_z]→, [R_z], AF=2, rows 1,...,N]

C) [with labels: ←[I_z]=[I_kal], [R_z]→, [R], AF=2, rows 1,...,N]

METHOD AND DEVICE FOR MAGNETIC RESONANCE IMAGING ON THE BASIS OF A PARTIALLY PARALLEL ACQUISITION (PPA)

BACKGROUND OF THE INVENTION

1. Field of the Invention

The present invention concerns magnetic resonance tomography (MRT) in general, as applied in medicine to examine patients. The present invention concerns a method as well as an MRT system to implement the method that significantly reduce the computation time in PPA-based image reconstruction according to known PPA methods (for example GRAPPA) without loss of signal-to-noise ratio (SNR).

2. Description of the Prior Art

MRT is based on the physical phenomenon of nuclear magnetic resonance and has been successfully used for over 15 years as an imaging modality in medicine and biophysics. In this examination modality, the subject is exposed to a strong, constant magnetic field. The nuclear spins of the atoms in the subject, which were previously randomly oriented, thereby align.

Radio-frequency energy can now excite these "ordered" nuclear spins to a specific oscillation. This oscillation generates the actual measurement signal in MRT, which measurement signal is acquired by means of suitable acquisition coils. The measurement subject can thereby be spatially coded in all three spatial directions by the use of non-homogeneous magnetic fields generated by gradient coils. This allows a free selection of the slice to be imaged, so slice images of the human body can be acquired in all directions. As a non-invasive examination method, MRT as a slice imaging method in medical diagnostics is primarily characterized by a versatile contrast capability. Due to the excellent presentation capability of the soft tissue, MRT has developed into a method superior in many ways to x-ray computed tomography (CT). MRT today is based on the application of spin echo and gradient echo sequences that enable an excellent image quality with measurement times on the order of seconds to minutes.

The steady technical development of the components of MRT apparatuses and the introduction of fast imaging sequences continues to open more fields of use for MRT in medicine. Real-time imaging to assist minimally-invasive surgery, functional imaging in neurology and performance measurement in cardiology are only a few examples. In spite of the technical advances in the construction of MRT apparatuses, acquisition times and signal-to-noise ratio (SNR) of an MRT image remain limiting factors for many applications of MRT in medical diagnostics.

A reduction of the acquisition time (the data acquisition time) while maintaining an acceptable SNR is desirable, particularly in functional imaging in which a significant movement of the subject or parts of the subject is always present (blood flow, heart movement, peristalsis of the abdomen etc.). In general, movement causes artifacts in an MRT image, for example movement artifacts that increase with the duration of the data acquisition time. In order to improve the image quality, it would be conceivable to acquire multiple images and to later superimpose these images. This does not always lead to an intended improvement of the overall image quality, however, particularly with regard to the movement artifacts. For example, the SNR is improved while the movement artifacts increase.

One approach to shorten the measurement time and thereby to keep the SNR loss within acceptable limits is to reduce the quantity of the image data to be acquired. In order to obtain a complete image from such a reduced data set, either the missing data must be reconstructed with suitable algorithms or the incomplete image must be corrected from the reduced data. The acquisition of the data in MRT occurs in a mathematical configuration known as k-space (local frequency domain). The MRT image in image space (image domain) is linked with the MRT data in k-space by means of Fourier transformation. The spatial coding of the subject which spans k-space occurs by means of gradients in all three spatial directions. In the case of 2D imaging, the slice selection (establishes an acquisition slice in the subject, typically the z-axis), the frequency coding (establishes a direction in the slice, typically the x-axis) and the phase coding (determines the second dimension within the slice, typically the y-axis) are thereby differentiated. In the case of 3D imaging, the slice selection is replaced by a second phase coding direction. Without limitation as to generality, in the further course of the description herein a two-dimensional Cartesian k-space is assumed that is scanned line-by-line. The data of a single k-space line are frequency-coded by means of a gradient upon readout. Each line in k-space has the interval $\Delta k_y$ that is generated by a phase coding step. Since the phase coding requires a large amount of time in comparison to other spatial codings, most methods (for example the aforementioned "partially parallel acquisition", designated in the following as PPA) are based on a reduction of the number of time-consuming phase coding steps to shorten the image measurement time. The fundamental idea in PPA imaging is that the k-space data are acquired not by a single coil but (according to FIG. 3A) by a (for example linear) arrangement of component coils (coil 1 through coil 3)—a coil array. Each of the spatially independent coils of the array has certain spatial information associated therewith that is used in order to achieve a complete spatial coding via a combination of the simultaneously acquired coil data. This means that multiple different displaced lines 32 (represented in following figures by dots) can also be determined (i.e. reconstructed) from a single acquired k-space line 31 (shown in grey in following figures). Such completed, reconstructed data sets are shown in FIG. 3B for the case of three component coils.

The PPA methods thus use spatial information that are contained in the components of a coil arrangement in order to partially replace the time-consuming phase coding that is normally generated using a phase coding gradient. The image measurement time is thereby reduced corresponding to the ratio of the number of lines of the reduced data set to the number of lines of the conventional (thus complete) data set. In a typical PPA acquisition, only a fraction (½, ⅓, ¼ etc.) of the phase coding lines are acquired in comparison to the conventional acquisition. A special reconstruction is then applied to the data in order to reconstruct the missing k-space lines, and therefore to obtain the full field of view (FOV) image in a fraction of the time.

The respective reconstruction method (which normally represents an algebraic method) corresponds to the respective PPA technique. The best known PPA techniques are image space-based methods such as SENSE (sensitivity encoding) and k-space-based methods such as GRAPPA (Generalized Autocalibration PPA) with their respective derivatives.

Additional calibration data points (additionally measured reference lines, for example 33 in FIG. 3) that are added to the actual measurement data and only on the basis of which a reduced data set can be completed again at all are not necessarily also acquired in all PPA methods.

In order to optimize the quality of the reconstruction and the SNR, a reconstruction according to GRAPPA—for example from a number N of incompletely measured data sets (except for the reference lines 33 of under-sampled coil images; FIG. 2: coil 1 to coil N)—again generates a number N of data sets (coil images) that—still in k-space—are respectively internally complete again. A Fourier transformation of the individual coil images thus leads to N aliasing-free single coil images whose combination in three-dimensional space (for example by means of sum-of-squares reconstruction) leads to an image optimized with regard to SNR and signal obliteration, however with the disadvantage that the calculation time for the GRAPPA image reconstruction is extremely increased given a high coil count.

The GRAPPA reconstruction (FIG. 2)—that, given N component coils, again leads to N complete single coil data sets—is based on a linear combination of the measured lines of an incomplete data set, wherein the determination of the (linear) coefficients necessary for this occurs in advance. For this it is sought to linearly combine the regular measured (thus the non-omitted) lines of an incomplete data set so that the additional measured reference lines (thus the calibration data points) are fitted to them with best possible fit. The reference lines thus serve as target functions that can be better adapted the more regular measured lines (possibly distributed among incomplete data sets of different component coils) that are present.

This means that, in the context of a GRAPPA reconstruction, the incomplete data sets of N component coils must be mapped to the N component coils again to complete these data sets. In this context, one also speaks of N GRAPPA input channels that are mapped to N GRAPPA output channels. This "mapping" ensues algebraically through a vector matrix multiplication, wherein the vectors represent the regular measured k-space lines and the matrix represents the determined GRAPPA coefficient matrix. In other words, this means that: if a linear combination of measured lines on the basis of a coefficient matrix yields a good approximately to the reference lines (calibration data points), omitted (and therefore not measured) lines of equal rank can be reconstructed just as well with this matrix. The coefficients are often also designated as weighting factors; the reference lines carry information about the coil sensitivities.

It can now be shown that the calculation time for the entire reconstruction method according to GRAPPA (i.e. for the determination of the GRAPPA coefficient matrix as well as for the mapping itself) possesses a quadratic (in some cases even a "super-quadratic") dependency on the coil count N, which is not of any significant consequence given a lower coil count (8 channels<<1 minute) but given a higher coil count (N≧32) leads to unacceptable calculation times with regard to computing capacity and memory capacity of the system computer.

In order to cope with the increasing requirements with regard to CPU load and computer memory in PPA imaging, the conventional approach has been to use more powerful computers with more access memory and main memory (RAM) as well as multiprocessor-based parallel computers that can execute the PPA reconstruction algorithms in parallel, but that inherently represent an immense cost factor.

A GRAPPA-like method is also known from DE 10 2005 018 814 B4 that accelerates the image reconstruction method in GRAPPA insofar as that the computer time is kept within presently tolerable limits, even given high coil count. This is achieved by no longer reconstructing all unmeasured k-space lines of each coil, and instead reconstructing only a subset (for example only every third line of each coil), which corresponds to the operation in what is known as the P-mode or primary mode of a hard-wired or software-based mode matrix configuration of the MRT apparatus. A slight reduction of the output channels already reduces the complexity of the GRAPPA reconstruction matrix such that the required computer time for GRAPPA reconstruction is significantly reduced. However, because all N (see FIG. 5A) incompletely measured data sets are no longer completed and Fourier-transformed by GRAPPA reconstruction, rather only a subset of the N incompletely measured data sets, and this reduced set of incomplete data sets is now completed, Fourier-transformed and superimposed by GRAPPA reconstruction (see FIG. 5B), this means that reconstructable information (the omitted k-space lines) is potentially discarded. This entails a certain degradation of the signal-to-noise ratio that must presently be accepted with reduction of the calculation time.

SUMMARY OF THE INVENTION

An object of the present invention is to provide a method as well as a system for implementation of the method that accelerate the PPA reconstruction, particularly given the use of a high number of PPA-coding component coils, without still forfeiting SNR (as is presently the case).

According to the invention, a method for magnetic resonance imaging of a contiguous region of a human body on the basis of a partially parallel acquisition (PPA) by excitation of nuclear spins and measurement of radio-frequency signals representing the excited spins, includes the following steps:

Step A: Calculation of a k-space single channel reference image [R_kal] from the previously measured reference lines of a sub-coil series of N sub-coils via a phase-sensitive combination method Step B: Calculation of a GRAPPA coefficient matrix [W] by solving the equation system $$[R\_kal]=[W]\times[I\_kal]$$

wherein [I_kal] represents one block from the sub-coil series

Step C: Successive completion of a k-space single channel image [R] via application of [W] to successive blocks [I_z] shifted relative to one another, said blocks [I_z] being of a previously measured, under-sampled sub-coil series of the N sub-coils, and transformation of [R] into image space.

The calculation of [R_kal] advantageously ensues via the ACC method.

Furthermore, the reference lines advantageously form a block of completely sampled k-space lines in the middle region of the sub-coil series (SP_k_kal1 to SP_k_kalN).

In an embodiment of the method according to the invention, the application of [W] to a block [I_z] yields a sub-matrix [R_z] from [R], wherein the same border line from [R_z] always corresponds to a measured k-space line in block [I_z], and the remaining k-space lines from [R_z] correspond to the omitted k-space lines in the block [I_z] adjacent to the border line.

In a further embodiment of the method according to the invention, the displacement length of the blocks corresponds to the acceleration factor AF in the event of a shift in the acceleration direction.

It is also advantageous when the block [I_kal] geometrically corresponds to the block [I_z].

The algebraic calculation of the matrix [W] as well as the entire algebraic reconstruction are particularly robust or, respectively, stable when the specified equation system is over-determined in Step B.

The above object is also achieved in accordance with the present invention by a magnetic resonance imaging apparatus having a control computer or sequence controller that is configured to implement the above-described method, to operate on magnetic resonance data acquired by a data acquisition device that is also a part of the apparatus.

The above object also is achieved in accordance with the present invention by a computer readable medium encoded with programming instructions, the medium being loadable into a computer of a magnetic resonance imaging system to cause the computer to process data in accordance with the method described above.

DESCRIPTION OF THE DRAWINGS

FIG. 3A shows the acquisition characteristic of the k-matrix in detail for three reduced data sets, including reference lines.

FIG. 3B shows the reconstructed (completed data sets) from FIG. 3A.

FIG. 5A shows a section through the under-sampled data block in GRAPPA.

FIG. 5B shows a section through the under-sampled and reduced data block for accelerated GRAPPA.

FIG. 5C shows a section through the under-sampled data block in the method according to the invention.

DESCRIPTION OF THE PREFERRED EMBODIMENTS

Figure 1:
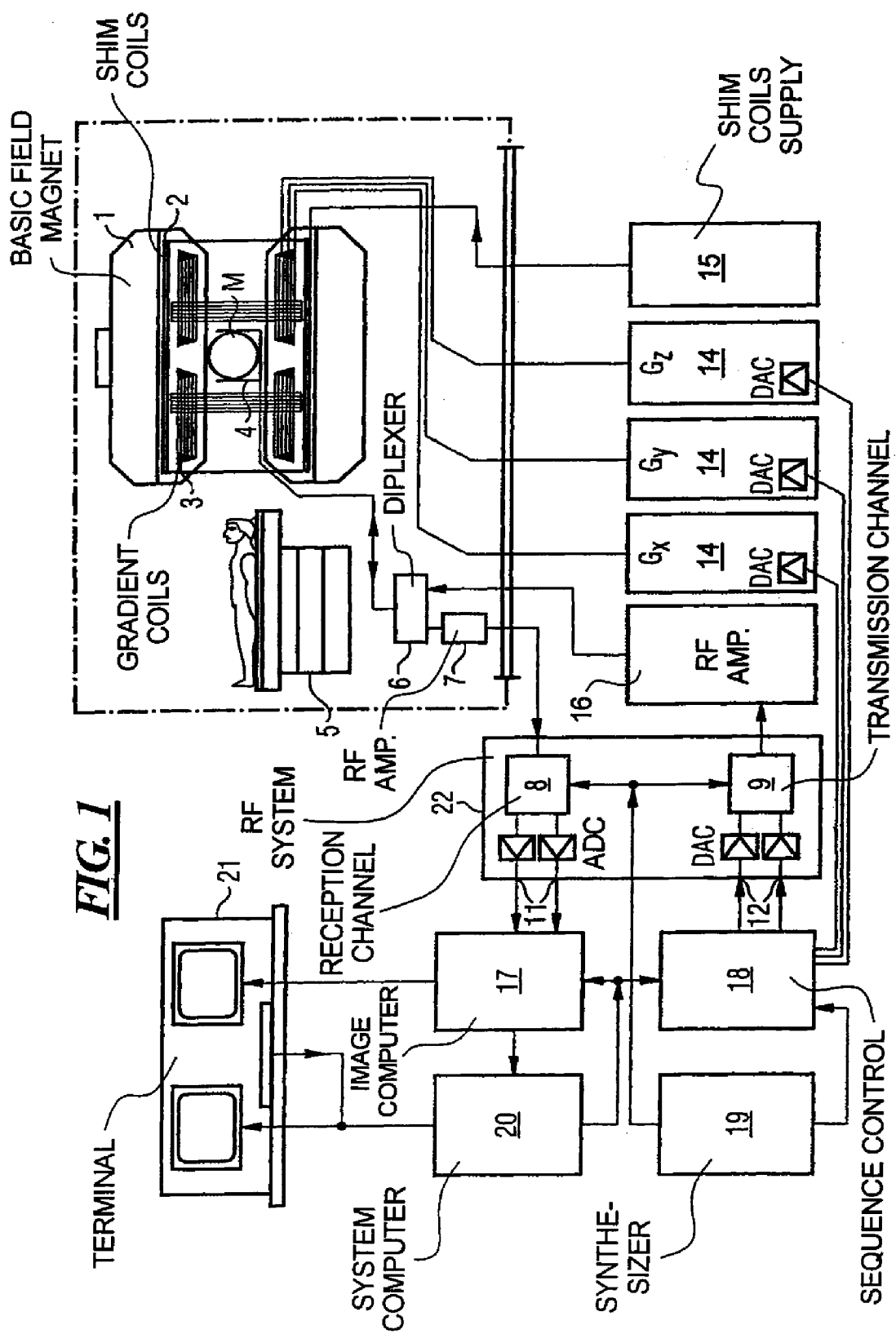
FIG. 1 schematically illustrates an MRT apparatus according to the invention for implementation of the method according to the invention.
Figure 2:
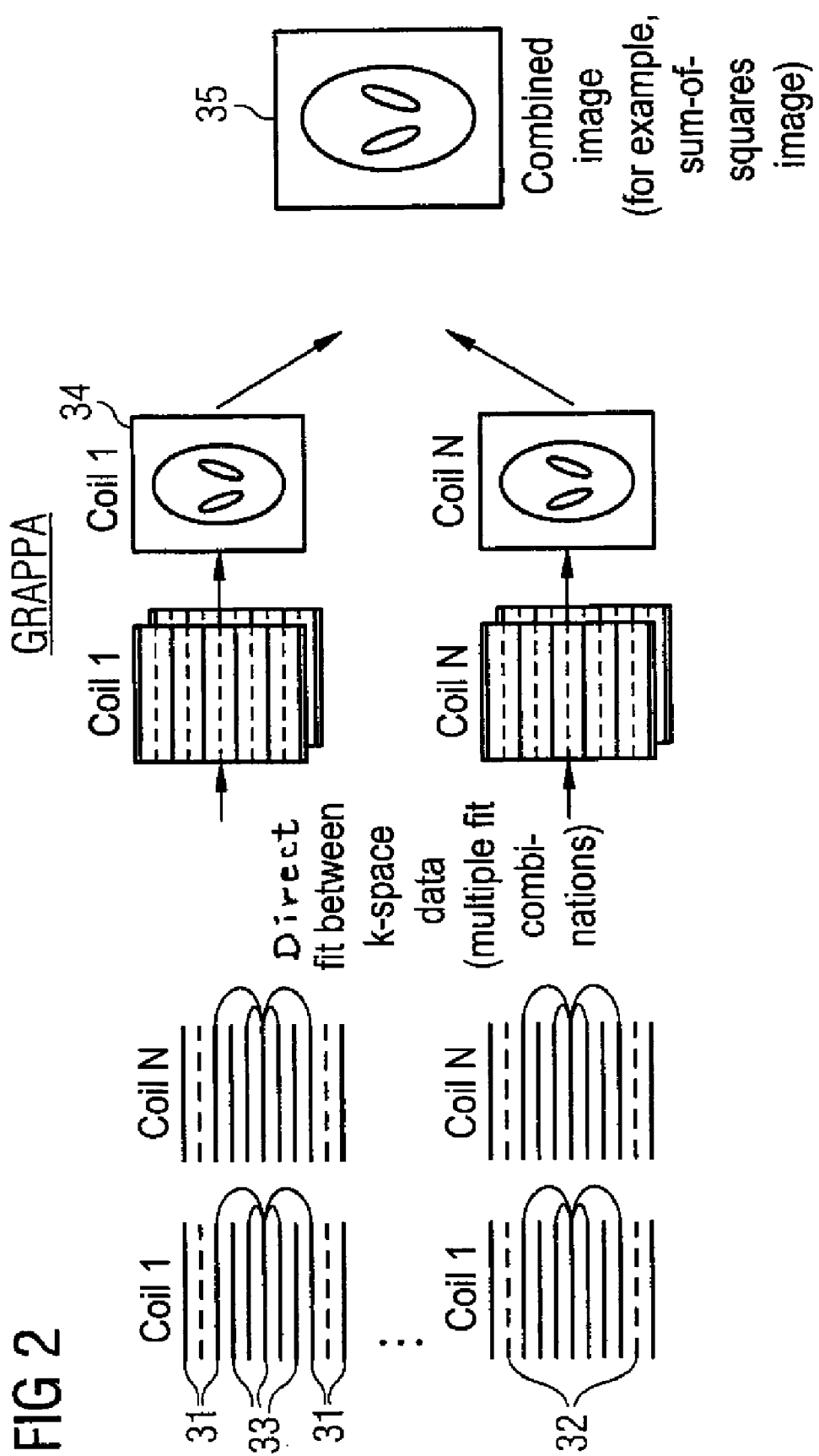
FIG. 2 schematically shows the procedure of the image reconstruction according to GRAPPA in principle.

FIG. 1 is a schematic representation of a magnetic resonance imaging or magnetic resonance tomography apparatus for generation of a magnetic resonance image of a subject according to the present invention. The basic design of the magnetic resonance tomography apparatus corresponds to the design of a conventional tomography apparatus, with the exceptions noted below. A basic field magnet 1 generates a temporally constant, strong magnetic field for orienting or alignment of the nuclear spins in the examination region of a subject, for example a part of a human body to be examined. The high homogeneity of the basic magnetic field that is required for the magnetic resonance measurement is defined in a measurement volume V into which the parts of the human body to be examined are introduced. Shim plates made of ferromagnetic material are attached at suitable points to support the homogeneity requirements, and in particular to eliminate temporally invariable influences. Temporally variable influences are eliminated by shim coils 2 that are activated by a shim power supply 15.

A gradient coil system composed of multiple windings (known as sub-windings) is used in the basic field magnet 1. Each sub-winding is supplied by an amplifier 14 with current to generate a linear gradient field in the respective direction of the Cartesian coordinate system. The first sub-winding of the gradient field system 3 generates a gradient $G_x$ in the x-direction, the second sub-winding a gradient $G_y$ in the y-direction and the third sub-winding a gradient $G_z$ in the z-direction. Each amplifier has a digital-analog converter that is controlled by a sequence controller 18 for accurately timed generation of the gradient pulses.

A radio-frequency antenna 4 is located within the gradient field system 3 The radio-frequency antenna 4 converts the radio-frequency pulses emitted by an radio-frequency power amplifier 16 into an alternating magnetic field to excite the nuclei and align the nuclear spins of the subject, or the region of the subject to be examined. The radio-frequency antenna 4 is composed of one or more RF transmission coils and multiple RF acquisition coils in the form of (for example) a linear arrangement of component coils in PPA imaging systems. The alternating field emanating from the precessing nuclear spins, i.e. normally the nuclear spin echo signals caused by a pulse sequence of one or more radio-frequency pulses and one or more gradient pulses, is also converted by the RF acquisition coils of the radio-frequency antenna 4 into a voltage that is supplied via an amplifier 7 to a radio-frequency acquisition channel 8 of a radio-frequency system 22. The radio-frequency system 22 furthermore has a transmission channel 9 in which the radio-frequency pulses are generated for the excitation of the nuclear magnetic resonance. The respective radio-frequency pulses are digitally represented in the sequence controller 18 as a series of complex numbers based on a pulse sequence predetermined by the system computer 20. This number sequence is supplied as real part and imaginary part to a digital-analog converter in the radio-frequency system 22 via respective inputs 12 and is supplied by this to a transmission channel 9. In the transmission channel 9, the pulse sequences are modulated on a radio-frequency carrier signal having a base frequency that corresponds to the resonance frequency of the nuclear spins in the measurement volume.

The switching from transmission mode to acquisition mode ensues via a transmission-reception duplexer 6. The RF transmission coil of the radio-frequency antenna 4 radiates the radio-frequency pulses to excite the nuclear spins in the measurement volume V and samples resulting echo signals via the RF acquisition coils. The correspondingly acquired magnetic resonance signals are phase-sensitively demodulated in the acquisition channel 8 of the radio-frequency system 22 and converted via respective analog-digital converters into a real part and an imaginary part of the measurement signal. An image is reconstructed by an image computer 17 from the measurement data acquired in this manner. The administration of the measurement data, the image data and the control programs ensues via the system computer 20. The sequence controller 18 monitors the generation of the respective desired pulse sequences and the corresponding sampling of k-space based on a specification with control programs. In particular, the sequence controller 18 controls the timed switching of the gradients, the emission of the radio-frequency pulses with defined phase and amplitude and the acquisition of the magnetic resonance signals. The time base (clock) for the radio-frequency system 22 and the sequence controller 18 is provided by a synthesizer 19. The selection of corresponding control programs to generate a magnetic resonance image as well as the representation of the generated magnetic resonance image ensues via a terminal 21 that has a keyboard as well as one or more monitors.

In order to be able to conduct PPA measurements with an MRT apparatus, it is conventionally standard to use not one single coil (in particular in the phase coding direction; y-direction, LIN) but an arrangement of multiple coils. These coils, known as component coils (sub-coils), are connected into a coil array and arranged adjacent to or overlapping with one another, so adjoining, overlapping coil images can likewise be acquired. If the acquisition time should not be lengthened with improvement of the SNR, the coils of the coil array must receive simultaneously. Each coil consequently requires its own receiver formed by the aforementioned amplifier, mixer and analog-digital converter. This hardware is very expensive, which in practice leads to a limitation of the number of coils in an array. Arrays with a maximum of 32 individual coils are presently the norm.

However, it is planned to distinctly increase the number of the component coils of a PPA coil array. Systems with up to 96 input channels are in the testing phase. It has been shown that this high number of PPA coils drastically increases the requirements for hardware and software of the system computer or of the system controller, for example with regard to the computing capacity and memory space. In some PPA methods, this increase of the capacity requirement is particularly high, for example in GRAPPA, which exhibits a super-quadratic dependency of the image reconstruction calculation time on the number of participating component coils.

As discussed above, the calculation time for the image reconstruction can be reduced by lowering the number of the reconstructed lines, but only to a limited degree and additionally only with severe loss of SNR, which results itself in a poor image quality.

The goal of the present invention is to specify a method that reduces the calculation time for image reconstruction without having to accept SNR losses, even given a high coil count.

The method according to the invention is, as before, based under-sampling the subject (for example the patient) located in the homogeneity volume of the MR apparatus with a defined number of PPA after a calibration, i.e. measuring only every second, third, fourth etc. k-space line, depending on the acceleration factor (AF), and reconstructing the lines missing due to the under-sampling.

The method according to the invention is explained in detail in the following using FIGS. 4, 5A through 5C and FIGS. 6 and 7. It is essentially comprised of two segments: the calibration (FIG. 6) and the reconstruction (FIG. 7).

Figure 4:
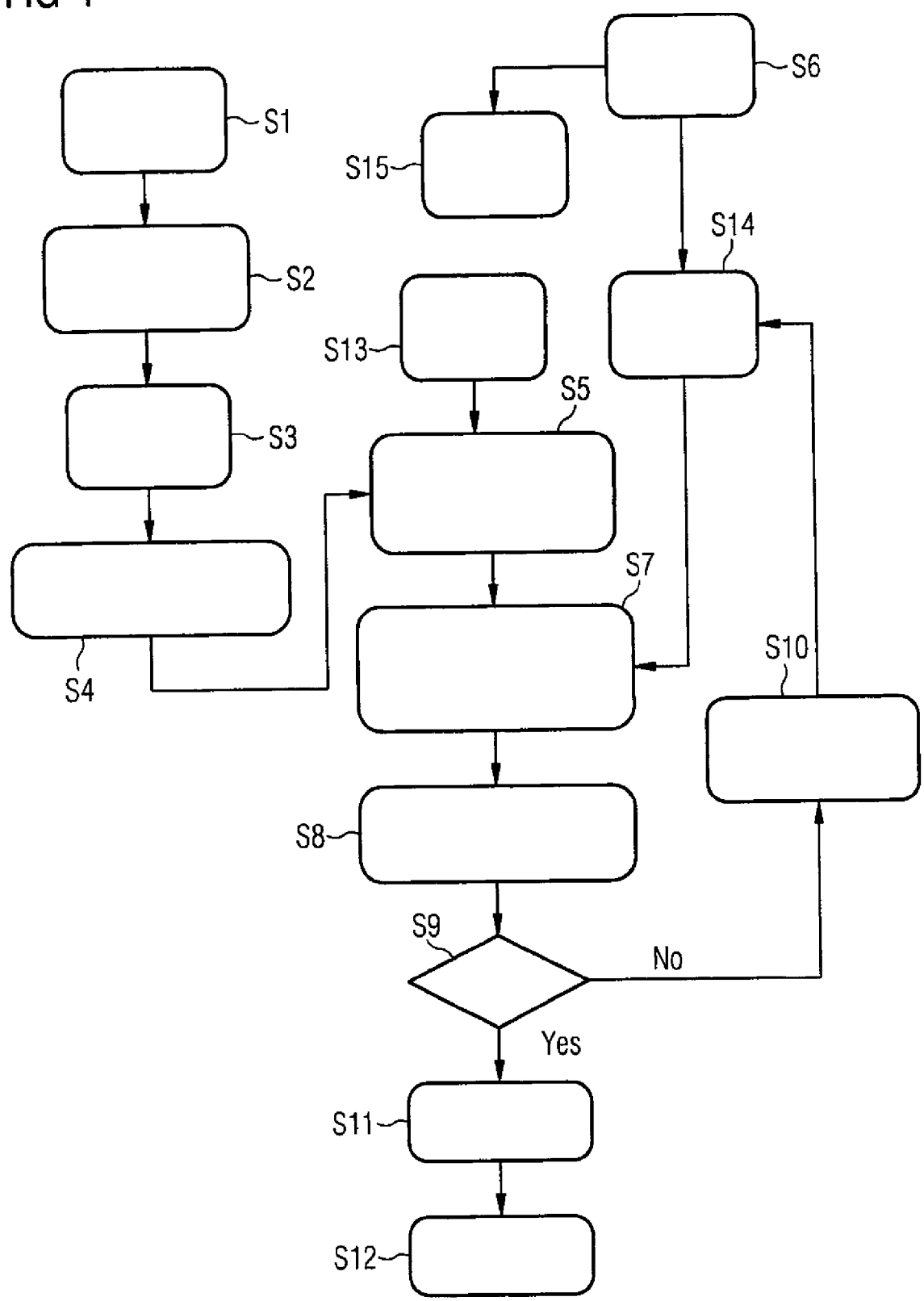
FIG. 4 shows an embodiment of the method according to the invention in a flowchart.

FIG. 4 shows a flowchart in which the individual steps of the method according to the invention are presented.

Figure 6:
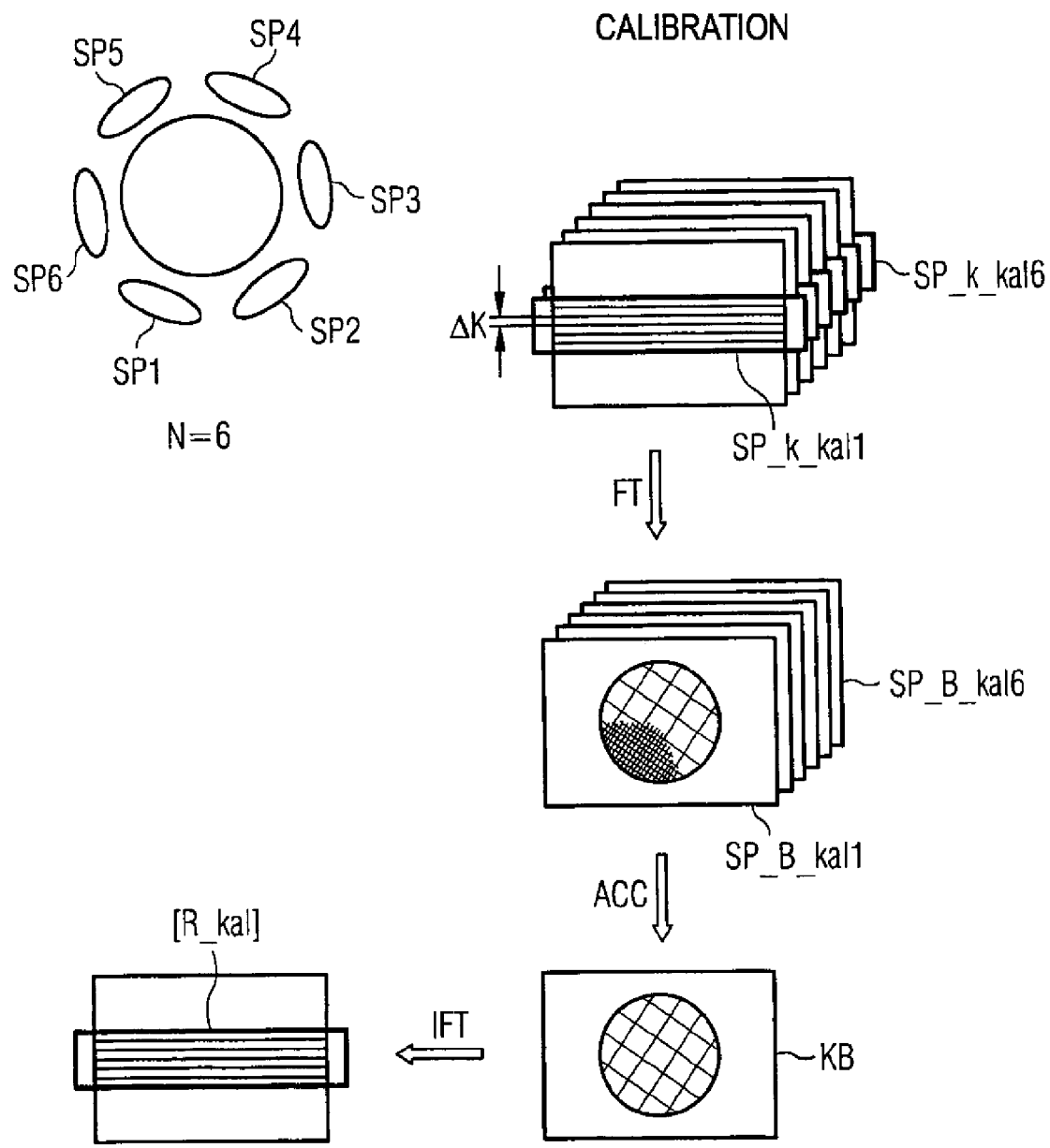
FIG. 6 shows the portion of the method for the calibration according to the invention.
Figure 7:
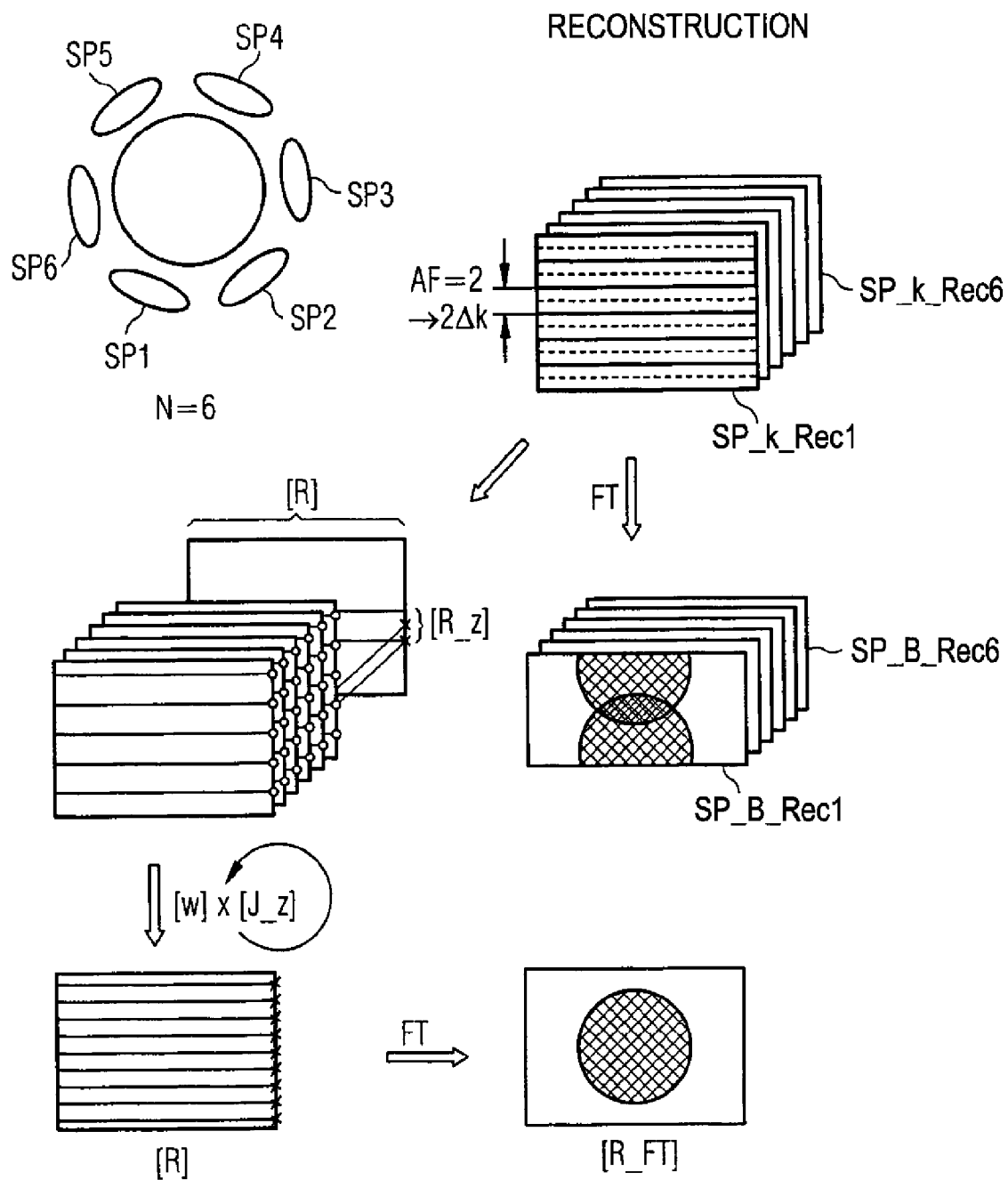
FIG. 7 shows the portion of the method for the reconstruction according to the invention.

FIGS. 6 and 7 further illustrate these steps.

In a first step S1, N sets of reference lines of a sub-coil series (SP_k_kal1 through SP_k_kalN) of N sub-coils (SP1 through SPN) are measured in k-space, advantageously in the central region of the respective k-matrix (SPk_i, i=1 through N). This is shown for N=6 in FIG. 6.

Given a coil count of N sub-coils (PPA coils), N partial data sets (not under-sampled but incomplete because too few lines are contained) SP_k_kal1 through SP_k_kalN are acquired in k-space.

In a further step S2, all N partial data sets (SP_k_kal1 through SP_k_kalN) are transformed via Fourier transformation (FT) in the image space. This yields a series of N subject slice images (partial images SP_B_kal1 through SP_B_kalN) that, depending on sub-coil arrangement and coil sensitivities, locally exhibit different intensity distributions.

The measurement values $B_i(x,y)$ of each i-th partial data set are complex $$B_i(x,y)=|B(x,y)|\cdot e^{i\phi(x,y)}\cdot |\epsilon_i(x,y)|\cdot e^{i\psi_i(x,y)}$$

wherein i=1. . . N represents the coil index. $|B(x,y)|$ corresponds approximately to the proton density $\rho(x,y)$ that, however, is also exposed to external influences (for example transversal or longitudinal relaxation). $\epsilon_i(x,y)=|\epsilon_i(x,y)|\cdot e^{i\psi_i(x,y)}$ represents the complex coil sensitivity of the coil i and is normalized so that applies.

$$\sum_{i=1}^{N}|\epsilon_i(x,y)|^2 = 1$$

Furthermore, $\phi(x,y)$ represents the phase of the MR signal and is equally large for all channels. This phase should also be maintained in a virtual channel after the signal combination of the individual channels. Last, $\psi_i(x,y)$ represents the phase of the respective coil sensitivity, which can be different for each coil i and should be eliminated by a phase-sensitive combination method (for example ACC) in the method according to the invention.

Since each partial data set inherently represents not an under-sampled data set, but rather an incomplete data set, although a resulting partial image is without aliasing it has only a low resolution (indicated by a rough diamond pattern in FIG. 6) that, however, is sufficient for the purpose of calibration.

In a next step S3, all partial images are combined into a single image in image space (combination image KB), and in fact such that no or only minimal information loss that would be expressed in a loss of SNR arises due to the combination.

There are various methods in order to implement such an "optimal combination" in image space. A method very suitable for this is presented in the following:

A method known as the ACC method (Adaptive Coil Combination) enables an optimal (i.e. largely SNR-loss-free) image combination with arbitrary SNR while preserving the phase information. As such, this method presently represents the best combination method for the inventive method. It is therefore used as a basis for description of the method according to the invention in the following.

In the ACC method, the individual measurement values $B_i(x,y)$ of each coil image are weighted with the complex conjugated coil sensitivity $\epsilon_i^*(x,y)$ of the respective coil i and added:

$$\begin{aligned}B'(x,y) &= \sum_{i=1}^{N} B_i(x,y)\cdot|\epsilon_i(x,y)|\cdot e^{-i\psi_i(x,y)}\\ &= \sum_{i=1}^{N}|B(x,y)|\cdot e^{i\phi(x,y)}\cdot|\epsilon_i(x,y)|\cdot e^{i\psi_i(x,y)}\cdot|\epsilon_i(x,y)|\cdot e^{-i\psi_i(x,y)}\\ &= |B(x,y)|\cdot e^{i\phi(x,y)}\cdot \sum_{i=1}^{N}|\epsilon_i(x,y)|^2\\ &= |B(x,y)|\cdot e^{i\phi(x,y)}\end{aligned}$$

The last step proceeds under the assumption that—as explained above—the coil sensitivities are preferably (but not necessarily) normalized so that it applies that:

$$\sum_{i=1}^{N}|\epsilon_i(x,y)|^2 = 1.$$

For example, the coil sensitivities can be determined via eigenvalue calculation of the correlation matrices. A combination image KB arising via ACC is still low-resolution, but without aliasing and complex, thus exhibits a phase and represents (with regard to SNR) an optimal, thus largely loss-free, combination of the reference lines of all sub-coil images.

Since this combination image KB is still complex in image space, in a further step S4 of the method according to the invention it can be transformed back into k-space again via an inverse Fourier transformation. This step S4 of the IFT back-transformation delivers a (two-dimensional) k-space matrix [R_kal] which was thus obtained via ACC from a series of low-resolution, coil-specific reference line blocks (k-space matrices SP_k_kal1 through SP_k_kalN)—see Step S1—and which therefore is likewise not high-resolution, i.e. complete. Since this back-transformed k-space matrix [R_Kal] is not associated with any specific channel (coil), but rather represents a combination of the reference lines of all coils (channels) via the ACC method, this k-space matrix is designated in the following as a "k-space single channel reference image [R_Kal]" or, respectively, as a "virtual channel [R_Kal]".

This virtual channel [R_Kal] in turn possesses reference lines (advantageously central k-space lines) that—like the reference lines in GRAPPA—serve as target functions for calculation of a (GRAPPA) reconstruction matrix [W] composed of reconstruction coefficients.

The calculation of the (reconstruction) coefficients of the matrix [W] ensues as in GRAPPA or, respectively, as in accelerated GRAPPA according to DE 102005018814 B4 (designated there as "calibration method" or "calibration") by solving an (preferably over-determined) linear equation system according to matrix [W] according to Step S5:

$$[R\_kal] = [W] \times [I\_kal]$$

Calibration: known sought known

[I_kal] represents a block of measurement values (reference lines) acquired in the calibration (thus in S1) that should be mapped by the matrix [W] to be determined to the lines or a subset of the lines of the virtual channel [R_Kal].

A "block" is geometrically defined according to Step S13 as to which measured lines of which omitted or virtual lines are (algebraically) used by means of linear combination for reconstruction.

Such a block is represented by dashed lines in FIG. 5C. Measured lines are depicted in cross-section and as small circles. Lines to be reconstructed are represented in cross-section and as crosses. A block effectively forms a geometric region or section (for example in cross-section) from all measured and omitted k-space limes to which the reconstruction matrix is to be applied in order to populate (i.e. to reconstruct) a k-space region to be reconstructed (for example, a matrix to be reconstructed in the calibration method: [R_kal]; a matrix [R] to be reconstructed in a reconstruction method or sub-matrices [R_z] forming and completing [R]). For example, "block size 4" with N sub-coils and acceleration fact AF=2 then means:

4 measured lines with three omitted lines (according to FIG. 5C: 4 columns with respectively N k-space lines measured by N sub-coils).

[R_kal] represents, as aforementioned, the reverse-transformed, low-resolution but complete combination image [KB] exhibiting no aliasing, which combination image [KB] is transformed back into k-space, in the form of a k-space matrix possessing reference lines, wherein these k-space lines (reference lines) serve as target functions in order to algebraically determine the GRAPPA reconstruction matrix [W] via linear combination of the coil images (SP_k_kal1 through SP_k_kalN or, respectively, the matrix [I_kal]) according to the above equation. In the case of AF=2 of the method according to the invention, [R_kal] is a matrix made up of two adjacent lines of the of the k-space single channel reference image (virtual channel) (in FIG. 5C, two adjacent crosses in the virtual channel) generated via ACC, wherein the one line always represents a measured line, the other line represents an omitted line of the block [I_kal] or, respectively, serves as a target function for fitting the values of [I_kal] to [R_kal] via [W].

In the cases AF=3, AF=4 etc., [R_kal] represents a matrix made up of three, four etc. adjacent lines, wherein one [R_kal]-border line always corresponds to a measured line of [I_kal] and the remaining lines from [R_kal] always correspond to adjacent omitted lines in [I_kal]. By shifting the block [I_kal] within the reference lines from [R_kal], the equation system to be solved can be over-determined and lead to a numerically more stable solution.

[W] thus represents the reconstruction matrix [W] that is calculated via the equation system specified above.

The goal is to reconstruct, in the reconstruction method and with the matrix [W] determined in the calibration, a high-resolution MR image [R_FT] from an under-sampled sub-coil series (SP_k_Rec1 through SP_k_RecN).

The calibration method (Steps S1 through S5 with S13) just presented in detail predominantly consists of algebraically determining the matrix [W] in order to be able to (likewise algebraically) obtain a complete, two-dimensional k-space data set [R] in an immediately following reconstruction method (Steps S6 through S10 with S14) without phase information loss and with minimal SNR loss.

The reconstruction method assumes in advance an incomplete or, respectively, at present empty (i.e. not populated with measurement points) k-space data set [R] that—like [R_kal]—represents a virtual channel and whose k-space lines to be reconstructed can be represented by sub-matrices [R_z]. According to the invention, the reconstruction is implemented so that the reconstruction matrix [W] is applied to a block [I_z] that geometrically corresponds to the block [I_kal] and represents partial data sets of the undersampled sub-coil series in Step S6.

In a first step S6 of the reconstruction (of [R]), an under-sampled sub-coil series of k-space is measured with i=N channels. In the next step S14, this data set is positioned within this data set of the block [I_z] just described. In a next step S7, the matrix [W] is applied to [I_z], whereby a sub-matrix [R_z] is completed (given AF=2, two adjacent lines within the matrix [R]). These two lines are symbolized as crosses in the virtual channel [R] in FIG. 5C, wherein the right virtual reconstructed line corresponds to a measured line, the left virtual reconstructed line to an omitted line (given AF>2, there are multiple omitted lines and therefore also multiple virtual reconstructed lines respectively at the position of these omitted lines). Both virtual reconstructed lines—and therefore [R_z]—are assumed in the virtual channel [R] in Step S8 according to $$[R] = [R] + [R\_z];$$

[R] is populated with measurement values at the current position of [R_z]. A systematic completion of [R] is now achieved in that, for example, according to Step S10 the block [I_z] and therefore the sub-matrix [R_z] perpendicular to the channel axis and to the k-space line direction is successively shifted in the one or the other direction, and in fact by AF columns in the case of the displacement in the non-acceleration direction (typically the readout direction). According to Step S14, after each block shift the data set of the sub-coil series must be updated in the now-displaced block. In a newly repeated Step S7, the reconstruction matrix [W] is applied to the displaced block [I_z] or, respectively, to the measurement values updated in the block according to the equation $$[R\_z]=[W]\times[I\_z]$$

Reconstruction: sought known known so a new sub-matrix [R_z] adjacent to the previously completed sub-matrix is completed, and the reconstructed measurement values incorporated into [R] according to the above equation. The block displacement—i.e. Steps S7, S8, S10 and S14—is repeated until it is detected in the repeated query S9 that the matrix [R] is entirely completed and an additional block displacement is no longer necessary. In this case, according to Step S11 the completed k-space data set [R] is transformed via Fourier transformation into the image space, whereby in Step S12 a high-resolution MR image [R_FT] is acquired. [R_FT] has no loss of phase information as well as only minimal loss of SNR and possesses no aliasing whatsoever.

The efficiency or the savings in calculation time of the method according to the invention is explained by a comparison with GRAPPA or with accelerated GRAPPA (see FIGS. 5A, 5B and 5C):

Assumed are: N=30 sub-coils (30 input channels); block size 4 (i.e. [I_kal]=[I_z] has 4 columns with 30 respective measured k-space lines); AF=2 (i.e. [I_z] has 3 columns with 30 respective, non-measured k-space lines due to a respective omitted line).

A reconstruction according to GRAPPA (FIG. 5A), accelerated GRAPPA (FIG. 5B) and according to the method according to the invention (FIG. 5C) then requires per reconstruction of [R_z]

| | Reconstructed channels | | Input channels | | Block size | | Complex multiplications |
|---|---|---|---|---|---|---|---|
| GRAPPA | 30 | × | 30 | × | 4 | = | 3600 |
| Accelerated GRAPPA (AF = 2, reduction ½) | 15 | × | 30 | × | 4 | = | 1800 |
| Method according to the invention | 2 | × | 30 | × | 4 | = | 240 |

The advantage of the method according to the invention becomes even clearer at high acceleration factors (for example AF=4)

| | | | | | | | | | |
|---|---|---|---|---|---|---|---|---|---|
| GRAPPA | 3 | | × | 30 | × | 30 | × | 4 | = 10800 |
| Accelerated GRAPPA (AF = 4, reduction ½) | 3 Omitted lines to be reconstructed | | × | 15 | × | 30 Measured channels in block [I] | × | 4 | = 5400 |
| Method according to the invention | 4 Omitted lines to be reconstructed + border line | | × | 1 | × | 30 | × | 4 | = 480 |

The fourteen step according to the invention according to FIG. 4 (Step S1 through Step S14) can be summarized in the following in only three steps for better clarity:

Step A: Calculation of a k-space single channel reference image [R_kal] from the previously measured reference lines of a sub-coil series of N sub-coils via a phase-sensitive combination method Step B: Calclation of a GRAPPA coefficient matrix [W] by solving the equation system $$[R\_kal]=[W]\times[I\_kal]$$

wherein [I_kal] represents one block from the sub-coil series

Step C: Successive completion of a k-space single channel image [R] via application of [W] to successive blocks [I_] shifted relative to one another, said blocks [I_] being of a previously measured, under-sampled sub-coil series of the N sub-coils, and transformation of [R] into image space.

It is noted that a three-dimensional implementation of the method according to the invention is also possible. The reconstruction then ensues either in k-space or mixed, both in k-space and in image space.

Although modifications and changes may be suggested by those skilled in the art, it is the intention of the inventor to embody within the patent warranted hereon all changes and modifications as reasonably and properly come within the scope of his contribution to the art.

I claim as my invention:

1. A method for magnetic resonance imaging of a contiguous region of a human body by partially parallel acquisition (PPA) by excitation of nuclear spins and measurement of radio-frequency signals representing the excited nuclear spins, comprising the steps of:

automatically electronically calculating a k-space single channel reference image [R_kal] of a subject from previously measured reference lines of a sub-coil series of N sub-coils with a phase-sensitive combination method;

automatically electronically calculating a GRAPPA coefficient matrix [W] by solving the equation system:

$$[R\_kal]=[W]\times[I\_kal]$$

wherein [I_kal] represents one block from the sub-coil series;

successively completing a k-space single channel image [R] by applying [W] to successive blocks [I_z] shifted relative to one another, said blocks [I_z] being of a previously measured, under-sampled sub-coil series of the N sub-coils, and transforming [R] into image space as a resulting image of the subject.

2. A method according to claim 1, comprising calculating [R_kal] with the ACC method.

3. A method according to claim 1, comprising using reference lines that form a block of completely sampled k-space lines in a middle region of the sub-coil series (SP_k_kal1 through SP_k_kalN)

4. A method according to claim 1, comprising applying [W] to a block [I_z] to produce a sub-matrix [R_z] of [R], wherein the same border line from [R_z] always correspond to a measured k-space line in the block [I_z], and remaining k-space lines from [R_z] correspond to the omitted k-space lines in the block [I_z] adjacent to the border line.

5. A method according to claim 1, comprising shifting the blocks by a displacement length in an acceleration direction corresponding to an acceleration factor AF.

6. A method according to claim 1 wherein the block [I_kal] geometrically corresponds to the block [I_z].

7. A method according to claim 1, comprising employing an over-determined equation system as said equation system that is solved.

8. A magnetic resonance apparatus comprising:
a data acquisition device comprising a radio-frequency transmission/reception system having a plurality of sub-coils; and
a processor configured to automatically calculate a k-space single channel reference image [R_kal] of a subject from previously measured reference lines of a sub-coil series of N of said sub-coils with a phase-sensitive combination method, automatically calculate a GRAPPA coefficient matrix [W] by solving the equation system, [R_kal]=[W]×[I_kal] wherein [I_kal] represents one block from the sub-coil series, and successively complete a k-space single channel image [R] by applying [W] to successive blocks [I_z] shifted relative to one another, said blocks [I_z] being of a previously measured, under-sampled sub-coil series of the N sub-coils, and transforming [R] into image space as a resulting image of the subject, and to make said resulting image of the subject available as an output from the processor.

9. A non-transitory computer-readable medium encoded with programming instructions, said medium being loadable into a computer of a magnetic resonance imaging system, and said programming instructions causing said computer to:
automatically electronically calculate a k-space single channel reference image [R_kal] of a subject from previously measured reference lines of a sub-coil series of N sub-coils with a phase-sensitive combination method;
automatically electronically calculate a GRAPPA coefficient matrix [W] by solving the equation system:

$$[R\_kal]=[W]\times[I\_kal]$$

wherein [I_kal] represents one block from the sub-coil series;
successively complete a k-space single channel image [R] by applying [W] to successive blocks [I_z] shifted relative to one another, said blocks [I_z] being of a previously measured, under-sampled sub-coil series of the N sub-coils, and transforming [R] into image space as a resulting image of the subject, and to make said resulting image available as an output.

* * * * *